United States Patent

[11] 3,581,244

[72] Inventor William Irving Smith Palmyra, N.J.
[21] Appl. No. 794,665
[22] Filed Jan. 28, 1969
[45] Patented May 25, 1971
[73] Assignee RCA Corporation

[54] AUTOMATIC IMPEDANCE MATCHING CIRCUITS FOR VARIABLE FREQUENCY SOURCE

3 Claims, 4 Drawing Figs.

[52] U.S. Cl. .......... 333/17, 333/32
[51] Int. Cl. .......... H03h 7/40
[50] Field of Search .......... 333/17, 17 (A), 32; 334/11, 12

[56] References Cited

UNITED STATES PATENTS 2,463,533 3/1949 Harrison .......... 333/17X

*Primary Examiner*—Herman Karl Saalbach
*Assistant Examiner*—Paul L. Gensler
*Attorney*—Edward J. Norton

ABSTRACT: An electronically controlled impedance transformer is disclosed in which a tapped inductor is used as the impedance matching coupling means between the source and the load, and in which the inductance of the inductor is changed in accordance with the change of frequency of the current supplied by the source to preserve the impedance match. The coupling means may be tuned and the tuning may be made to track with the change in frequency of the source while the impedance match is substantially preserved, for both high and low Q circuits.

Figures 1, 2, 3, 4:
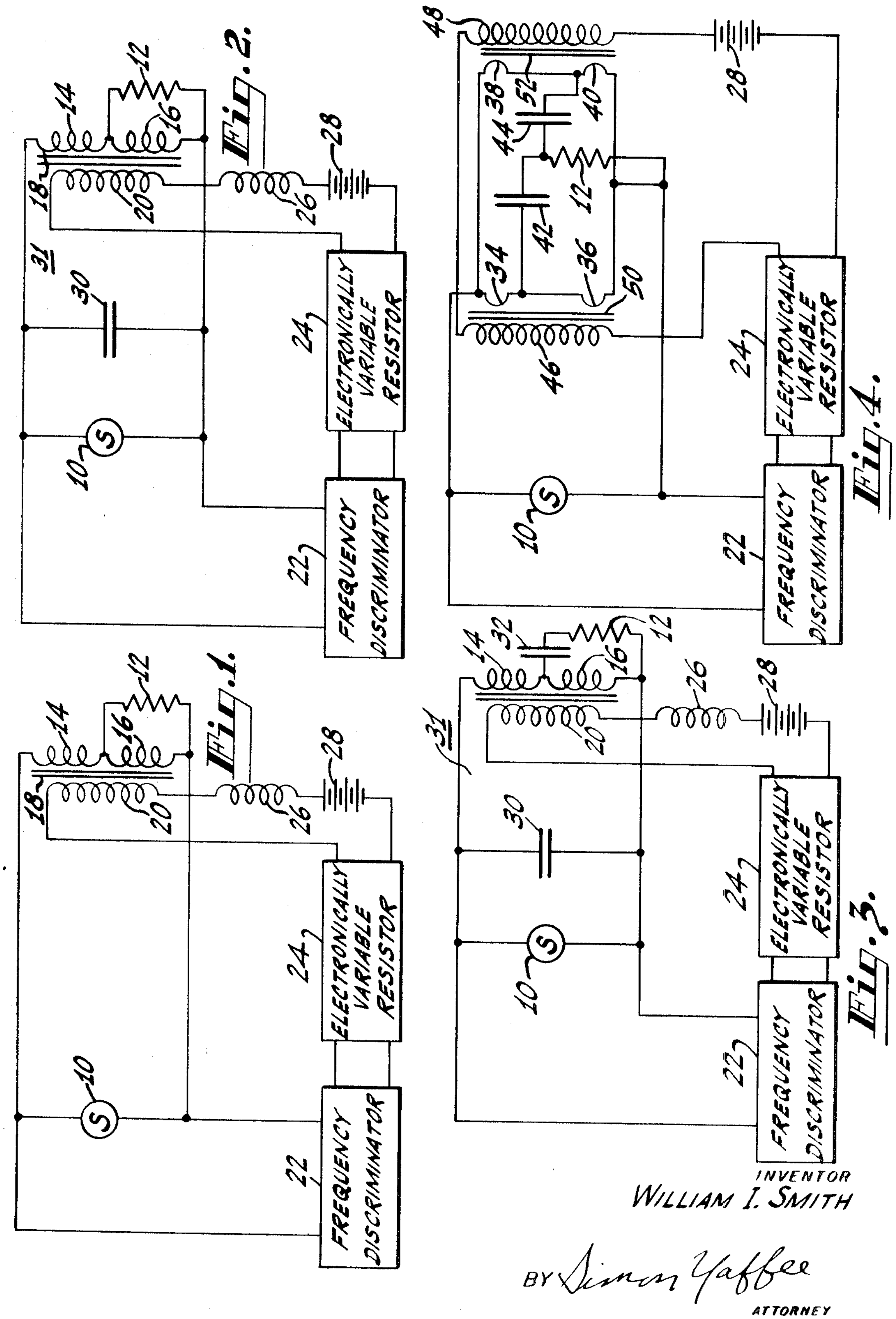

INVENTOR
WILLIAM I. SMITH
BY Simon Yaffee
ATTORNEY

AUTOMATIC IMPEDANCE MATCHING CIRCUITS FOR VARIABLE FREQUENCY SOURCE

The invention herein described was made in the course of or under a contract or subcontract thereunder with the Department of the Air Force.

This invention relates to an electronically controlled impedance transformer.

When a source having one value of impedance is coupled to a load having a different value of impedance, an impedance matching coupling means is provided. A known impedance matching means comprises a tapped inductor, the source or the load being connected across the outside terminals of the inductor and the load or the source being connected across an outside terminal and the tap on the inductor. If the frequency of the current supplied by the source varies, such a coupling does not provide impedance matching. Similarly, if the known impedance matching means is tuned to the frequency of the source and the frequency of the source varies, the impedance matching means is no longer tuned to the frequency of the source.

It is an object of this invention to provide an electronically adjustable impedance matching coupling means between a source and a load which maintains the impedance match even though the frequency of the source varies.

It is a further object of this invention to provide electronic adjustment of a tuned impedance matching coupling means between a source and a load to maintain the impedance match even though the frequency of the source varies and to tune the coupling to the changing frequency of the source as the frequency of the source varies.

In accordance with this invention, the reactance of the coupling device comprising a tapped inductor is varied as the frequency of the wave provided by the source varies to maintain constant coupling. Furthermore, in accordance with this invention, in the case where the coupling device is tuned, the reactance of the coupling device is varied as the frequency of the wave provided by the source varies not only to maintain the coupling substantially constant but also to vary the tuning of the coupling device in a manner to track the tuning of the coupling device with the frequency of the wave provided by the source.

The invention may be better understood upon reading the following description in connection with the accompanying drawing in which FIG. 1 illustrates an impedance coupling means in accordance with an embodiment of this invention, and FIGS. 2, 3 and 4 illustrate modifications of the coupling means of FIG. 1.

Considering FIG. 1, a source 10, having a first characteristic impedance, of waves is coupled to a resistive load 12 having a different characteristic impedance. The source 10 is connected across a pair of inductors 14 and 16 connected in series and the load 12 is connected across the inductor 16. The ratio of the reactances of the inductors 14 and 16 is chosen as to provide impedance matching between the source 10 and the load 12, as long as the frequency of the wave provided by the source 10 does not vary substantially.

For an impedance match to exist, the ratio of the voltage across the load 12 and the voltage across the source 10 must be constant. This ratio is constant if the ratio of the impedances of the inductors 14 and 16 is constant and also if the ratio of the resistance of the load 12 to the product of the impedances of the inductors 14 and 16 divided by the sum of the impedances of the inductors 14 and 16 is constant. If, as shown, the two inductors 14 and 16 are wound on the same ferrite core 18, then the ratio of the impedances of the inductors 14 and 16 remains constant even though the frequency of the source 10 varies. The second ratio, that is, the ratio of the resistance of the load to the product of the impedances of the inductors 14 and 16 divided by the sum of the impedances of the inductors 14 and 16, can be kept constant as the frequency of the source varies by changing the inductance of each of the inductors 14 and 16. This is done by varying the current flowing through an inductor 20 which is magnetically coupling to the core 18, inversely in accordance with the change of frequency of the source 10. As illustrated in FIG. 1, the output of the source 10 is also applied to a frequency discriminator 22. The output of the frequency discriminator 22 is applied to control the resistance of a variable resistor 24. The resistor 24, which may be the emitter to collector path of a transistor (not shown) is connected in series with the inductor 20, a choke coil 26 and a direct current source 28. Therefor, as the frequency of the source 10 varies, the current flowing through the inductor 20 varies and the magnetic field produced in the ferrite core 18 varies causing the impedances of the inductors 14 and 16 to vary in such a manner as to keep the above mentioned second ratio constant. Therefore, in the disclosure of FIG. 1, the impedance of the source 10 is always a match to the impedance of the load 12 even though the frequency of the source 10 may vary. The choke coil 26 prevents the signal wave provided by the source 10 from being dissipated in the circuit including the direct current source 28.

FIG. 2 differs from FIG. 1 only in that the inductors 14 and 16 are tuned as by the provision of a tuning capacitor 30 connected across the inductors 14 and 16 in series. As has been indicated above, the sum of the inductances of the inductors 14 and 16 may vary inversely with the frequency of the source 10 to maintain the impedance match between the source 10 and the load 12 constant. To make the tuning of the tuned circuit 14, 16 and 30 to track the frequency of the source 10, the inductances of the inductors 14 and 16 must also vary inversely as, but as the square of, the frequency of the source 10. The tuning of the circuit comprising the inductors 14 and 16 and the capacitor 30 may be tracked with the output frequency of the source 10 and still maintain the impedance match sufficiently constant for most practical purposes when the Q of the matching circuit including the load 12 is equal to or greater than five. This is due to the fact that the circulating current through the source 10 and the current through the load 12 are at right angles, and when the Q is greater than five, the circulating current through the source 10 is so much greater than the current drawn by a load, that the vector sum of the circulating and of the load current is not very different from the circulating current alone. Where the Q is less than five, the circuit of FIG. 3 may be used to cause the tuned circuit 31 including the elements 30, 14 and 16 to track the frequency of the source 10 and also to maintain the coupling between the source 10 and the load 12 substantially constant.

The circuit of FIG. 3 differs from the circuit of FIG. 2 only in the inclusion of a capacitor 32 between the connection to the junction of the inductors 14 and 16 and the load 12. The reactance of the capacitor 32 is so chosen that it is equal to the ratio of the product of the reactance of the inductors 14 and 16 to the sum of these reactances at any frequency in the range over which the tuning of the circuit 31 is to track. When the value of the capacitor 32 is so chosen, the circuit of FIG. 3 acts as if the capacitor 32 and the load 20 are omitted as far as the tuning of the circuit 31 is concerned, and also the ratio of the signal voltages appearing across the source 10 and the load 12 remains substantially constant as the tuned circuit 31 is tuned over its tuning band.

In each of FIGS. 1, 2 and 3, the choke coil 26 is provided to prevent shunting of the source currents through the direct current circuit including the direct current source 28. The circuit of FIG. 4 does not require a choke coil. The source 10 in FIG. 4 is connected across inductors 34 and 36 connected in series and also across inductors 38 and 40 connected in series. The load 12 is connected in a series circuit between one terminal of both of the inductors 36 and 40 and the junction of the inductance 34 and 36 by way of a capacitor 42. The load 12 is also connected in a series circuit between one terminal of each of the inductors 36 and 40 and the junction of the inductors 38 and 40 by way of a capacitor 44. The source 10 is also connected across the input terminals of a frequency discriminator 22. The output terminals of the discriminator 22 is connected to the input terminals of an electronically variable resistor 24 and the output terminals of the variable resistor 24 are connected together by way of a series circuit including inductors 46 and 48 and a direct current source 28. A common ferrite core 50 is provided for the inductors 34, 36 and 46 and a common ferrite core 52 is provided for the inductors 38, 40 and 48. The inductance varying effect of the inductor 46 on the inductors 34 and 36 and the inductance varying effect of the inductor 48 on the inductors 38 and 40 are in the same direction while the signal frequency currents buck themselves out in the two inductors 46 and 48, whereby no choke coil is necessary in the series circuit including the source 28 to prevent dissipation of signal waves in this circuit. Otherwise, the circuits of FIGS. 3 and 4 operate similarly in that the impedance match of the source 10 and the load 12 is maintained constant even though the frequency of the source 10 may vary.

What I claim is:

1. An impedance matching circuit for providing optimum power transfer from a variable frequency source having a given impedance to a load having a different impedance where the ratio of the impedance of the source to the impedance of the load remains constant comprising:

- a transformer of the type having a pair of inductors connected in series with said source coupled across said inductors in series and said load coupled across one of said pair of inductors,
- means for sensing when the frequency of said source varies, and
- means responsive to said sensing means for varying the inductance of both of said pair of inductors with respect to the variation in the frequency of said source to match the impedance of said source to the impedance of said load over a wide band of frequencies.

2. The combination as claimed in claim 1 wherein said transformer includes a ferrite core and said means to vary the inductances of said inductors includes means to vary a magnetic field which is applied to said core.

3. The invention as claimed in claim 1 including a tuning capacitor connected across said pair of inductors in series, said means to vary the inductances of said inductors causing the reactance of said inductors to vary inversely as a square of the frequency change of said source whereby the tuned circuit including said tuning capacitor and said inductors track the frequency variations of said source and whereby over a wide band of frequencies the impedance of said source is matched to the impedance of said load.